US009983264B2

(12) United States Patent
Hsueh et al.

(10) Patent No.: US 9,983,264 B2
(45) Date of Patent: May 29, 2018

(54) MULTIPLE DEFECT DIAGNOSIS METHOD AND MACHINE READABLE MEDIA

(71) Applicant: Realtek Semiconductor Corp., HsinChu (TW)

(72) Inventors: Pei-Ying Hsueh, Changhua County (TW); Chun-Yi Kuo, New Taipei (TW); Chien-Mo Li, Taipei (TW); Chieh-Chih Che, Taoyuan County (TW)

(73) Assignee: Realtek Semiconductor Corp., HsinChu (TW)

( * ) Notice: Subject to any disclaimer, the term of this patent is extended or adjusted under 35 U.S.C. 154(b) by 652 days.

(21) Appl. No.: 14/519,109

(22) Filed: Oct. 20, 2014

(65) Prior Publication Data

US 2015/0204939 A1 Jul. 23, 2015

(30) Foreign Application Priority Data

Jan. 21, 2014 (TW) .............................. 103102174 A

(51) Int. Cl.
*G01R 31/3183* (2006.01)

(52) U.S. Cl.
CPC .................. *G01R 31/31835* (2013.01); *G01R 31/318357* (2013.01); *G01R 31/318371* (2013.01)

(58) Field of Classification Search
CPC ................................................ G01R 31/31835
See application file for complete search history.

(56) References Cited

U.S. PATENT DOCUMENTS

| 5,862,149 A * | 1/1999 | Carpenter ...... G01R 31/318583 |
| | | 714/726 |
| 2010/0121585 A1* | 5/2010 | Wang ............. G01B 31/318547 |
| | | 702/59 |

* cited by examiner

*Primary Examiner* — Manuel A Rivera Vargas
(74) *Attorney, Agent, or Firm* — Winston Hsu

(57) ABSTRACT

A multiple defect diagnosis method includes: receiving a gate-level netlist of a chip, a plurality of test patterns and a plurality of test failure reports; deriving a plurality of seed nets from the gate-level netlist according to the plurality of test patterns and the plurality of test failure reports; utilizing a processor to compute similarity between the plurality of seed nets, and accordingly merging the plurality of seed nets to obtain a single seed net tree; and deriving at least one suspected seed net according to the single seed net tree.

14 Claims, 5 Drawing Sheets

| Failures | The first pattern $P_1$ | | | The second pattern $P_2$ | | |
|---|---|---|---|---|---|---|
| | $O_1$ | $O_2$ | $O_3$ | $O_1$ | $O_2$ | $O_3$ |
| TF | X | | X | X | | |
| SF of $f_1$ | X | | | X | | |
| SF of $f_2$ | | | X | | X | X |
| SF of $SN_1$ | X | | X | X | | |

| Failures | The first pattern $P_1$ | | | The second pattern $P_2$ | | |
|---|---|---|---|---|---|---|
| | $O_1$ | $O_2$ | $O_3$ | $O_1$ | $O_2$ | $O_3$ |
| TF | X | | X | X | | |
| SF of $f_1$ | X | | | X | | |
| SF of $f_2$ | | | X | | X | X |
| SF of $SN_1$ | X | | X | X | | |

| Pattern | Seed net SN₁ | | | | Seed net SN₂ | | | |
|---|---|---|---|---|---|---|---|---|
| | $O_1$ | $O_2$ | $O_3$ | $O_4$ | $O_1$ | $O_2$ | $O_3$ | $O_4$ |
| $P_1$ | X | X | | | X | X | | |
| $P_2$ | | X | | | | X | | X |
| $P_3$ | X | | X | X | X | | X | |

FIG. 5

| Seed net | $O_1$ | $O_2$ | $O_3$ | $O_4$ | $O_5$ | Cluster |
|---|---|---|---|---|---|---|
| $SN_1$ | | | ✓ | | | $C_1$ |
| $SN_2$ | ✓ | ✓ | ✓ | | | $C_1$ |
| $SN_3$ | ✓ | | ✓ | | | $C_1$ |
| $SN_4$ | | | | ✓ | ✓ | $C_2$ |
| $SN_5$ | | | | | ✓ | $C_2$ |

FIG. 6

| Failures | The first pattern $P_1$ | | | | | The second pattern $P_2$ | | | | |
|---|---|---|---|---|---|---|---|---|---|---|
| | $O_1$ | $O_2$ | $O_3$ | $O_4$ | $O_5$ | $O_1$ | $O_2$ | $O_3$ | $O_4$ | $O_5$ |
| TF | X | X | X | X | X |  | X |  | X |  |
| SF of $SN_1$ |  |  | X |  |  |  | X |  |  |  |
| SF of $SN_2$ | X | X | X |  |  |  | X |  |  |  |
| SF of $SN_3$ | X |  | X |  |  | X |  |  |  |  |
| SF of $SN_4$ |  |  |  | X | X |  |  |  | X |  |
| SF of $SN_5$ |  |  |  | X | X |  |  |  |  | X |

MULTIPLE DEFECT DIAGNOSIS METHOD AND MACHINE READABLE MEDIA

BACKGROUND OF THE INVENTION

1. Field of the Invention

The disclosed embodiments of the present invention relate to a defect diagnosis method, and more particularly, to a multiple defect diagnosis method which is applicable to a multiple defect case.

2. Description of the Prior Art

To fix yield problems in IC manufacturing, identifying root causes of systematic defects is critical. Physical failure analysis (PFA) is conducted on selected dies to understand defect mechanisms. Since PFA is a time-consuming and expensive process, the selection of dies should be carefully guided by systematic defect diagnosis. In recent studies, many dies have been discovered which have multiple defects; this issue therefore cannot be ignored in systematic defect diagnosis.

There are three main categories of multiple defect diagnosis. The first category uses covering-based methods. Multiple defect diagnosis is modeled as a minimum set covering problem, wherein a minimum set of faults is selected to cover all test failures of a pattern. A fault covers a pattern if simulation failures of the fault are exactly the same as test failures of the pattern. Simulation failures (SF) are results of fault simulation, while test failures (TF) are responses from automated test equipment (ATE).

The second category incrementally finds a fault at a time in order to correct a circuit. These techniques select a fault iteratively and update the SF of the circuit which is obtained by multiple fault simulation. The selection of faults continues until the SF of the circuit and the TF match. These techniques require many iterations of multiple fault simulation, which is time-consuming.

The last category generates diagnostic patterns to distinguish faults by different responses. Although the ease of diagnosis and resolution can be improved by using diagnostic patterns, the use of many iterations of testing is too expensive for production ICs.

In light of the above, there is an urgent need for a novel multiple defect diagnosis method which can improve the above issues.

SUMMARY OF THE INVENTION

A multiple defect diagnosis method and an associated non-transitory machine readable medium are disclosed to improve the aforementioned issues.

According to an exemplary embodiment of the present invention, a multiple defect diagnosis method is disclosed. The method comprises:
receiving a gate-level netlist, a plurality of test patterns and a plurality of test failures of a chip; deriving a plurality of seed nets from the gate-level netlist according to the plurality of test failures and the plurality of test patterns; utilizing a processor to calculate similarities between the plurality of seed nets, to merge the plurality of seed nets accordingly to generate a single seed-net tree; and deriving at least one suspected seed net according to the single seed-net tree.

According to another exemplary embodiment of the present invention, a non-transitory machine readable medium is disclosed, wherein when executed by a processor, a program code enables the processor to perform a multiple defect diagnosis method, the method comprising: receiving a gate-level netlist, a plurality of test patterns and a plurality of test failures of a chip; deriving a plurality of seed nets from the gate-level netlist according to the plurality of test failures and the plurality of test patterns; utilizing a processor to calculate similarities between the plurality of seed nets, to merge the plurality of seed nets accordingly to generate a single seed-net tree; and deriving at least one suspected seed net according to the single seed-net tree.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram illustrating an example of calculating similarities between seed nets.

FIG. 6 is a diagram illustrating an example of cluster partitioning of the seed-net tree shown in FIG. 4.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
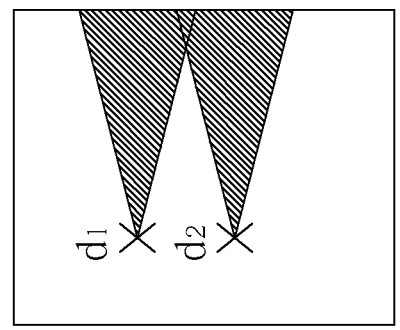
FIG. 1 is a diagram illustrating the three types of failing patterns.
Figure 1:
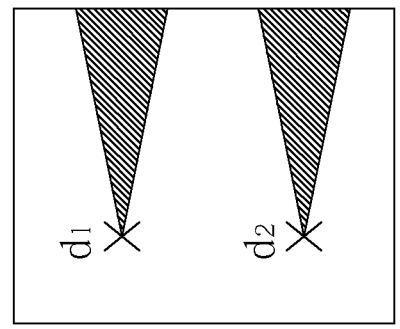
Figure 1:
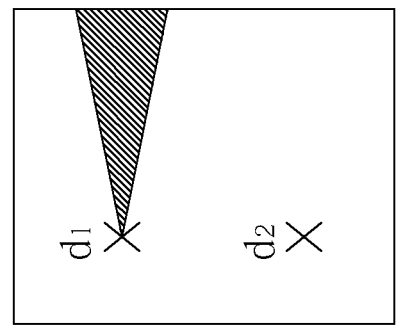

The concept of the present invention is to utilize limited information of the die under test in order to analyze the correlation between elements of the limited information according to the disclosed multiple defect diagnosis method. In this way, a defect region is narrowed down to one or more than one seed net, such that massive iterative simulations on a computer or tests on an ATE can be avoided. Specific descriptions regarding the present invention are given in the following. When multiple defects occur in a die, the failing patterns are divided into three types. FIG. 1 is a diagram illustrating the three types of failing patterns. Please note that the pattern mentioned here refers to patterns generated by an automatic test pattern generation system (ATPG). When a result outputted from a chip is different from a predetermined result by applying a pattern, the pattern will be regarded as a failing pattern. In FIG. 1, a chip has a first defect $d_1$ and a second defect $d_2$ located at different positions. In FIG. 1(A), a type-1 pattern only activates the first defect $d_1$ and propagates its faulty effect to a portion of the outputs. In FIG. 1(B), a type-2 pattern activates both the first defect $d_1$ and the second defect $d_2$ but propagates their faulty effects to different outputs. Faults do not interact with each other, since their propagation paths do not overlap. In FIG. 1(C), a type-3 pattern also activates the first defect $d_1$ and the second defect $d_2$, which interact with each other. Fault masking or reinforcement may occur by applying type-3 patterns. The embodiments of the present invention mainly relate to cases in FIG. 1(A) and FIG. 1(B).

Figure 2:
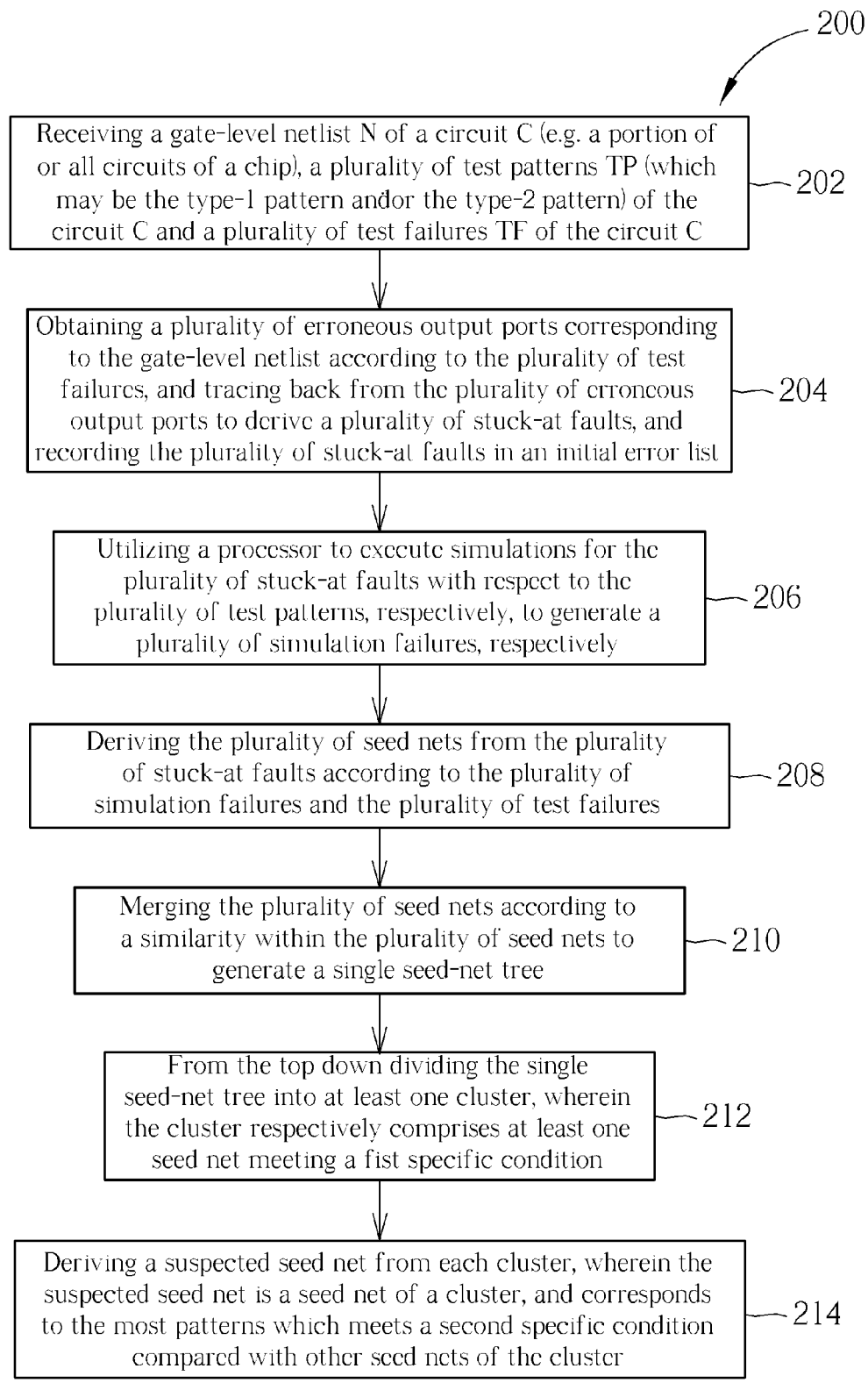
FIG. 2 is a flowchart illustrating a multiple defect diagnosis method according to an exemplary embodiment of the present invention.

FIG. 2 is a flowchart illustrating a multiple defect diagnosis method 200 according to an exemplary embodiment of the present invention. Provided that substantially the same result is achieved, the steps of the flowchart shown in FIG. 2 need not be in the exact order shown and need not be contiguous; that is, other steps can be intermediate. Some steps in FIG. 2 may be omitted according to various embodiments or requirements. The multiple defect diagnosis method 200 may be briefly summarized as follows. In step S202, a gate-level netlist N of a circuit C (e.g. a portion of or all circuits of a chip), a plurality of test patterns TP (which may be the type-1 pattern and/or the type-2 pattern) of the circuit C and a plurality of test failures TF of the circuit C are received. In step S204, a plurality of erroneous output ports corresponding to the gate-level netlist N are obtained according to the plurality of test failures TF, and a plurality of stuck-at faults are derived by tracing back from the plurality of erroneous output ports. The plurality of stuck-at faults is recorded in an initial error list. Please note that each one of the plurality of stuck-at faults may be a culprit defect, and analysis with respect to the plurality of stuck-at faults are performed in the subsequent steps.

In step S206, a processor is utilized for executing simulations (a.k.a. fault simulation) for the plurality of stuck-at faults with respect to the plurality of test patterns TP, respectively, to generate a plurality of simulation failures SF, respectively. The plurality of stuck-at faults can be deliberately produced by breaking the construction (e.g. cutting a wire) at the corresponding location of the gate-level netlist N of the circuit C, and then using the processor to execute simulations for the plurality of stuck-at faults by applying the plurality of test patterns TP, respectively, and generating the plurality of simulation failures SF, respectively. In step S208, the plurality of seed nets SN are derived from the plurality of stuck-at faults according to the plurality of simulation failures SF and the plurality of test failures TF, which reduces the nets that need to be considered in the following steps. Determining the seed nets SN requires initial derivation of the seed fault, wherein a seed net includes at least a net of a seed fault. A plurality of seed faults can be screened out from the plurality of stuck-at faults by using equation (1):

$$\Sigma_{TP\in(type-1+type-2)}\text{Min}(\text{Num}(TPSF),\text{Num}(TFSF))=0 \quad (1)$$

where TFSF denotes outputs observed both in the plurality of test failures TF and the plurality of simulation failures SF; and TPSF denotes outputs observed only in the plurality of simulation failures SF.

Figures 3, 4:
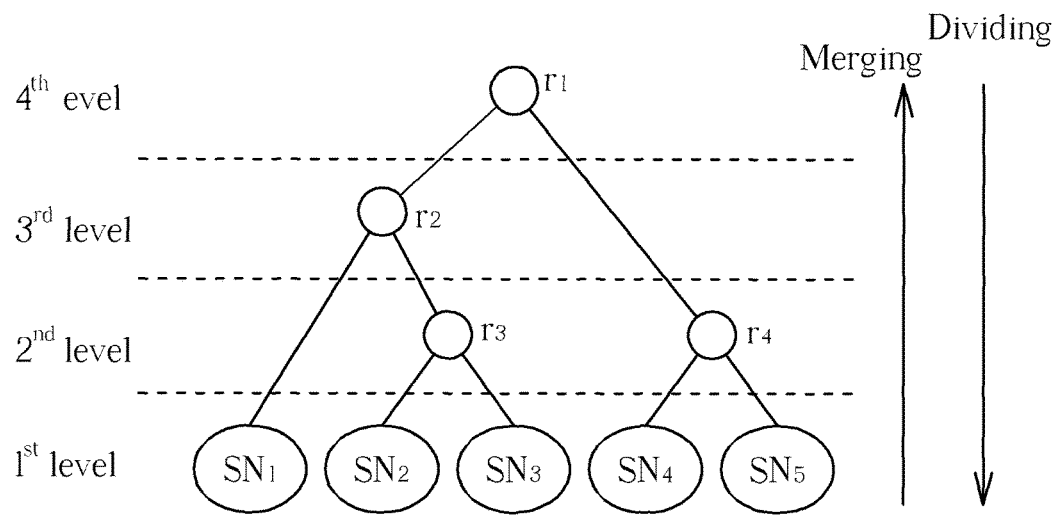
FIG. 3 is a diagram illustrating an example of simulation failures of a seed net.
FIG. 4 is a diagram illustrating an example of a seed-net tree.

Those skilled in the art should readily understand how to identify the plurality of seed nets SN from the seed faults; details thereof are omitted for brevity. Next, the plurality of test patterns TP are applied to the plurality of seed nets SN, respectively, to obtain a plurality of seed net simulation failures SNSF. FIG. 3 is a diagram illustrating an example of simulation failures of a seed net $SN_1$. For a first pattern $P_1$ and a second pattern $P_2$, if the seed net $SN_1$ includes only two seed faults $f_1$ and $f_2$, then erroneous outputs (i.e. $O_1$ and $O_3$) induced by the seed faults $f_1$ and $f_2$ can both be observed in the plurality of test failures TF with respect to the first pattern $P_1$. Hence, for the first pattern $P_1$, the simulation failures of the seed net $SN_1$ are a union of the simulation failures of the seed faults $f_1$ and $f_2$. For the second pattern $P_2$, the erroneous outputs (i.e. $O_1$) induced by the seed faults $f_1$ can be observed in the plurality of test failures TF, but the erroneous outputs (i.e. either $O_2$ and $O_3$) induced by the seed faults $f_2$ cannot be observed in the plurality of test failures TF. Hence, for the second pattern $P_2$, the simulation failures of the seed net $SN_1$ are solely the simulation failures of the seed faults $f_1$.

In step S210, the plurality of seed nets SN are merged according to similarities within the plurality of seed nets SN. The merging is completed gradually by employing data mining. In this way, the plurality of seed nets SN are merged one after another from the bottom up to establish a single seed-net tree. Please refer to FIG. 4, which is a diagram illustrating an example of a seed-net tree. In the first level of the seed-net tree, there is a plurality of seed nets $SN_1$-$SN_5$, wherein the seed nets $SN_1$-$SN_5$ may be regarded as five seed-net tree units. Then, two of the plurality of seed nets with the highest similarity are merged into a first node (e.g. a node $r_1$ of the level 4, a node $r_2$ of the level 3, nodes $r_3$ and $r_4$ of the level 2) to replace the original seed-net trees, until only one seed-net tree remains. The similarity can be derived using equation (2):

$$sim_{tree}(T_i, T_j) = \frac{\sum\limits_{A\in L(T_i)}\sum\limits_{B\in L(T_j)} sim_{net}(A, B)}{|L(T_i)||L(T_j)|} \quad (2)$$

where $T_i$ and $T_j$ denote two seed-net trees, $L(T_i)$ and $L(T_j)$ represent the set of seed nets in $T_i$ and $T_j$, and $sim_{net}(A, B)$ denotes the similarity between two seed nets A and B.

Equation (3) shows how to calculate $sim_{net}(A, B)$:

$$sim_{net}(A, B) = \frac{\sum\limits_{p\in FP} |SF_A^P \cap SF_B^P|}{\sum\limits_{p\in FP} |SF_A^P \cup SF_B^P|} \quad (3)$$

where $SF_A^P$ and $SF_B^P$ denote the plurality of simulation failures SF of the seed net A and the seed net B by applying a pattern p, respectively. FP represents the set of failing patterns on the ATE. Equation (3) only considers failing patterns, which provide information about culprit defects. SF of passing patterns are ignored in similarity calculation.

FIG. 5 is a diagram illustrating an example of calculating a similarity of a seed net $SN_1$ and a seed net $SN_2$. For a failing pattern $P_1$, $|SF_A^P \cap SF_B^P|$ and $|SF_A^P \cup SF_B^P|$ both equal 2; for a failing pattern $P_2$, $|SF_A^P \cap SF_B^P|$ is 1 and $|SF_A^P \cup SF_B^P|$ is 2; for a passing pattern $P_3$, the plurality of simulation failures SF are ignored. Using equation (3), $sim_{net}(SN_1, SN_2)$ is ¾.

In step S212, the single seed-net tree is divided from the top down into a plurality of sub seed-net trees (i.e. a plurality of clusters). Cluster partitioning will stop when each sub-seed-net tree contains at least one seed net meeting a first specific condition, i.e. a seed net whose failing outputs include all erroneous outputs of the sub-seed-net tree. Failing outputs of a seed net are the union of outputs where the plurality of simulation failures SF is observed by applying any test pattern. Erroneous outputs of a sub-seed-net tree are the union for failing outputs of all seed nets in the sub-seed-net tree. After cluster partitioning, seed nets in a sub-seednet tree belong to the same cluster. FIG. 6 is a diagram illustrating an example of cluster partitioning of the seed-net tree shown in FIG. 4. There are five seed nets $SN_1$-$SN_5$ and five erroneous outputs $O_1$-$O_5$. Each check in the table represents that the output is a failing output of the corresponding seed net. At first, the seed-net tree with node $r_1$ is partitioned into two sub-seed-net trees with nodes $r_2$ and $r_4$. This is because there is no seed net whose failing outputs include all erroneous outputs $O_1$-$O_5$. For the sub-seed-net tree with node $r_2$, failing outputs of the seed net $SN_2$ includes all of the erroneous outputs $O_1$-$O_3$. Hence, a cluster $C_1$: $\{SN_1, SN_2, SN_3\}$ is composed of seed nets in the sub-seed-net tree with node $r_2$. For the sub-seed-net tree with node $r_4$, failing outputs of $SN_4$ includes all of the erroneous outputs: $O_4$-$O_5$. Hence, a cluster $C_2$: $\{SN_4, SN_5\}$ is composed of seed nets in the sub-seed-net tree with node $r_4$. Finally, cluster partitioning ends with two clusters, $C_1$ and $C_2$.

Figures 7, 8:
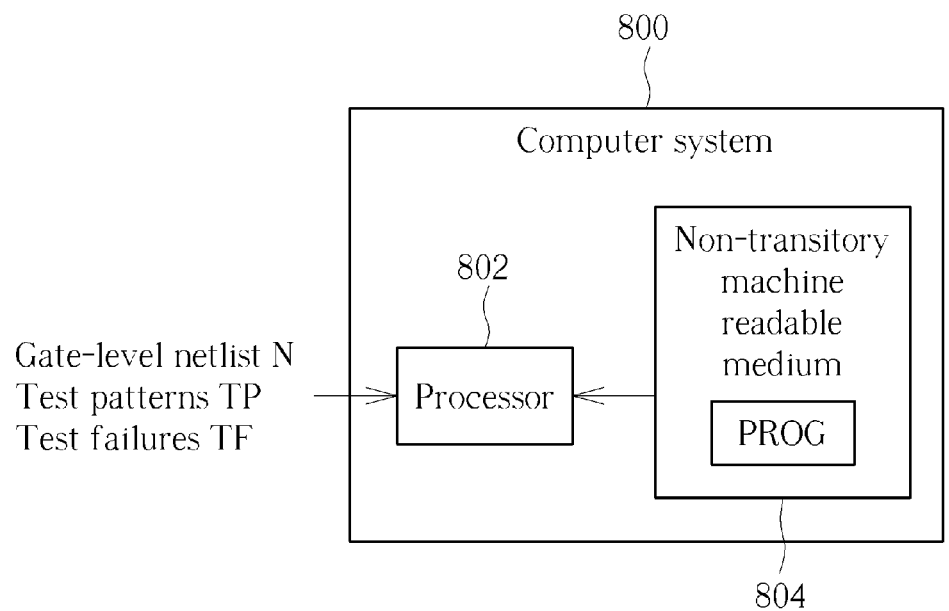
FIG. 7 is a diagram illustrating an example of finding a suspected seed net from the seed-net tree of FIG. 4.
FIG. 8 is a diagram illustrating a computer system for performing the multiple defect diagnosis method according to an exemplary embodiment of the present invention.

In step S214, a suspected seed net is found out from each cluster obtained in step S210, where the suspected seed net is a seed net of a cluster, and corresponds to the most patterns which meet a second specific condition compared with other seed nets of the cluster. Given a seed net and a pattern, simulation failure result of the seed net must be the same as test failure results observed at erroneous outputs of the cluster to which the seed net belongs. The erroneous outputs of a cluster are a union of all erroneous outputs of respective seed net simulation failures of each seed net in the cluster. FIG. 7 is a diagram illustrating an example of finding a suspected seed net from the seed-net tree of FIG. 4. There are two failing patterns $P_1$, $P_2$ and five seed nets $SN_1$-$SN_5$. Each 'X' represents a failure observed at the corresponding output. Two clusters $C_1$: $\{SN_1, SN_2, SN_3\}$ and $C_2$: $\{SN_4, SN_5\}$ are the results of cluster partitioning shown in step S210. The erroneous outputs of the cluster $C_1$ are $O_1$, $O_2$ and $O_3$, while those of the cluster $C_2$ are $O_4$ and $O_5$. The pattern $P_1$ meets the second specific condition for the seed net $SN_2$, since the plurality of simulation failures SF of the seed net $SN_2$ are exactly the same as the plurality of test failures TF on erroneous outputs of the cluster $C_1$. The pattern $P_1$ also meets the second specific condition for both the seed nets $SN_4$ and $SN_5$, since the plurality of simulation failures SF of the seed nets $SN_4$ and $SN_5$ are exactly the same as the plurality of test failures TF on erroneous outputs of the cluster $C_2$. The pattern $P_2$ meets the second specific condition for both the seed nets $SN_1$ and $SN_2$, and also meets the second specific condition for $SN_4$. For the cluster $C_1$, since the seed net $SN_2$ meets the second specific condition for 2 patterns, it is selected as a suspected seed net. Similarly, for the cluster $C_2$, the seed net $SN_4$ is selected as a suspected seed net.

Please refer to FIG. 8, which is a diagram illustrating a computer system 800 for performing the multiple defect diagnosis method according to an exemplary embodiment of the present invention. The computer system 800 includes a processor 802 and a non-transitory machine readable medium 804. For instance, the computer system 800 could be a personal computer, and the non-transitory machine readable medium 804 could be any storage device capable of storing data in a personal computer, e.g. a volatile memory, non-volatile memory, hard disk or CD-ROM. In this embodiment, the non-transitory machine readable medium 804 stores a program code PROG, wherein when the program code PROG is loaded and executed by the processor 802, the program code PROG enables the processor to perform the disclosed multiple defect diagnosis method (i.e. the steps 202-214 shown in FIG. 2) of the present invention for a netlist N of a circuit C according to a plurality of test patterns TP and a plurality of test failures TF of the circuit C. Those skilled in the art will readily understand the deadlock detection processed by making the processor 802 execute the program code PROG; further description is therefore omitted here for brevity.

Compared with the conventional multiple defect diagnosis, the multiple defect diagnosis method disclosed herein can analyze the correlation between the erroneous outputs corresponding to internal suspected seed nets, to find out the most possible locations where the defects occur at one time. The time and cost for iterative testing are therefore effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A multiple defect diagnosis method, comprising:
   receiving a gate-level netlist, a plurality of test patterns and a plurality of test failures of a chip;
   deriving a plurality of seed nets from the gate-level netlist according to the plurality of test failures and the plurality of test patterns;
   utilizing a processor to calculate similarities between the plurality of seed nets, to merge the plurality of seed nets accordingly to generate a single seed-net tree; and
   determining at least one suspected seed net from the plurality of seed nets according to the single seed-net tree, so as to narrow down a defect region of the chip to the at least one determined suspected seed net.
2. The multiple defect diagnosis method of claim 1, wherein the step of deriving the plurality of seed nets from the gate-level netlist according to the plurality of test failures and the plurality of test patterns comprises:
   obtaining a plurality of erroneous output ports corresponding to the gate-level netlist according to the plurality of test failures, and tracing back from the plurality of erroneous output ports to derive a plurality of stuck-at faults;
   executing simulations for the plurality of stuck-at faults with respect to the plurality of test patterns, respectively, to generate a plurality of simulation failures, respectively; and
   deriving the plurality of seed nets from the plurality of stuck-at faults according to the plurality of simulation failures and the plurality of test failures.
3. The multiple defect diagnosis method of claim 1, wherein the step of utilizing the processor to calculate the similarities between the plurality of seed nets comprises:
   executing simulations for the plurality of seed nets with respect to the plurality of test patterns, respectively, to generate a plurality of seed net simulation failures, respectively; and
   calculating the similarities between the plurality of seed nets according to the plurality of seed net simulation failures and the plurality of test failures.
4. The multiple defect diagnosis method of claim 1, wherein the step of merging the plurality of seed nets accordingly to generate the single seed-net tree comprises:
   merging two of the plurality of seed nets with the highest similarity into a first node; and
   merging two of the unmerged seed nets and the first node with the highest similarity into a second node.

5. The multiple defect diagnosis method of claim 1, wherein the step of determining the suspected seed net according to the single seed-net tree comprises:
- from the top down dividing the single seed-net tree into at least one cluster, wherein the cluster respectively comprises at least one seed net meeting a first specific condition; and
- deriving a suspected seed net from each cluster, wherein the suspected seed net is a seed net of a cluster, and corresponds to the most patterns which meets a second specific condition compared with other seed nets of the cluster.

6. The multiple defect diagnosis method of claim 5, wherein all erroneous outputs of a seed net simulation failures of the seed net which meets the first specific condition are the same as erroneous outputs of the cluster, wherein the erroneous outputs of the cluster are a union of all erroneous outputs of respective seed net simulation failures of each seed net of the cluster.

7. The multiple defect diagnosis method of claim 5, wherein erroneous outputs of the test failure result of the pattern corresponding to a cluster to which the seed net belongs are the same as erroneous outputs of the simulation failure result of the seed net corresponding to the cluster to which the seed net belongs, and the erroneous outputs of the cluster are a union of all erroneous outputs of respective seed net simulation failures of each seed net of the cluster.

8. A non-transitory machine readable medium storing a program code, wherein when executed by a processor, the program code enables the processor to perform a multiple defect diagnosis method, the method comprising:
- receiving a gate-level netlist, a plurality of test patterns and a plurality of test failures of a chip;
- deriving a plurality of seed nets from the gate-level netlist according to the plurality of test failures and the plurality of test patterns;
- utilizing a processor to calculate similarities between the plurality of seed nets, to merge the plurality of seed nets accordingly to generate a single seed-net tree; and
- determining at least one suspected seed net from the plurality of seed nets according to the single seed-net tree, so as to narrow down a defect region of the chip to the at least one determined suspected seed net.

9. The non-transitory machine readable medium of claim 8, wherein the step of deriving the plurality of seed nets from the gate-level netlist according to the plurality of test failures and the plurality of test patterns comprises:
- obtaining a plurality of erroneous output ports corresponding to the gate-level netlist according to the plurality of test failures, and tracing back from the plurality of erroneous output ports to derive a plurality of stuck-at faults;
- executing simulations for the plurality of stuck-at faults with respect to the plurality of test patterns respectively, to generate a plurality of simulation failures respectively; and
- deriving the plurality of seed nets from the plurality of stuck-at faults according to the plurality of simulation failures and the plurality of test failures.

10. The non-transitory machine readable medium of claim 8, wherein the step of utilizing the processor to calculate the similarities between the plurality of seed nets comprises:
- executing simulations for the plurality of seed nets with respect to the plurality of test patterns, respectively, to generate a plurality of seed net simulation failures, respectively; and
- calculating the similarities between the plurality of seed nets according to the plurality of seed net simulation failures and the plurality of test failures.

11. The non-transitory machine readable medium of claim 8, wherein the step of merging the plurality of seed nets accordingly to generate the single seed-net tree comprises:
- merging two of the plurality of seed nets with the highest similarity into a first node; and
- merging two of the unmerged seed nets and the first node with the highest similarity into a second node.

12. The non-transitory machine readable medium of claim 8, wherein the step of deriving determining the suspected seed net according to the single seed-net tree comprises:
- from the top down dividing the single seed-net tree into at least one cluster, wherein the cluster respectively comprises at least one seed net meeting a first specific condition; and
- deriving a suspected seed net from each cluster, wherein the suspected seed net is a seed net of a cluster, and corresponds to the most patterns which meets a second specific condition compared with other seed nets of the cluster.

13. The non-transitory machine readable medium of claim 12, wherein all erroneous outputs of a seed net simulation failures of the seed net which meet the first specific condition are the same as erroneous outputs of the cluster, wherein the erroneous outputs of the cluster are a union of all erroneous outputs of respective seed net simulation failures of each seed net of the cluster.

14. The non-transitory machine readable medium of claim 12, wherein erroneous outputs of the test failure result of the pattern corresponding to a cluster to which the seed net belongs are the same as erroneous outputs of the simulation failure result of the seed net corresponding to the cluster to which the seed net belongs, and the erroneous outputs of the cluster are a union of all erroneous outputs of respective seed net simulation failures of each seed net of the cluster.

* * * * *